(12) United States Patent
Sir et al.

(10) Patent No.: US 7,678,616 B2
(45) Date of Patent: Mar. 16, 2010

(54) THERMAL MANAGEMENT METHOD INCLUDING A METALLIC LAYER DIRECTLY ON AN INTEGRATED HEAT SPREADER AND INTEGRATED CIRCUIT

(75) Inventors: Jiun Hann Sir, Penang (MY); Chee Koang Chen, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/143,038

(22) Filed: Jun. 20, 2008

(65) Prior Publication Data

US 2008/0254573 A1  Oct. 16, 2008

Related U.S. Application Data

(62) Division of application No. 11/090,396, filed on Mar. 25, 2006, now Pat. No. 7,439,618.

(51) Int. Cl.
*H01L 21/44* (2006.01)
*H01L 21/48* (2006.01)

(52) U.S. Cl. ........................... 438/122; 438/125

(58) Field of Classification Search ................ 438/122, 438/125; 257/706, 707, 712, 713, 717–720, 257/E23.101
See application file for complete search history.

(56) References Cited

U.S. PATENT DOCUMENTS

| | | | |
|---|---|---|---|
| 6,519,154 B1 | 2/2003 | Chiu | |
| 6,829,143 B2 | 12/2004 | Russell et al. | |
| 7,006,354 B2* | 2/2006 | Mochizuki et al. | .......... 361/705 |
| 7,026,711 B2 | 4/2006 | Lee et al. | |
| 7,271,479 B2* | 9/2007 | Zhao et al. | .................. 257/704 |

* cited by examiner

*Primary Examiner*—Hung Vu
(74) *Attorney, Agent, or Firm*—Schwabe, Williamson & Wyatt, P.C.

(57) ABSTRACT

An apparatus, method, and system for providing thermal management for an integrated circuit includes a first metallic layer directly placed on a back surface of the integrated circuit. An integrated heat spreader with a substantially cap-like shape is placed over the integrated circuit, with an aperture of a ceiling wall of the integrated heat spreader exposing a back surface of the integrated circuit at least in part. The first metallic layer is directly placed on top of an exterior surface of the ceiling wall of the integrated heat spreader as well as the back surface of the integrated circuit.

9 Claims, 9 Drawing Sheets

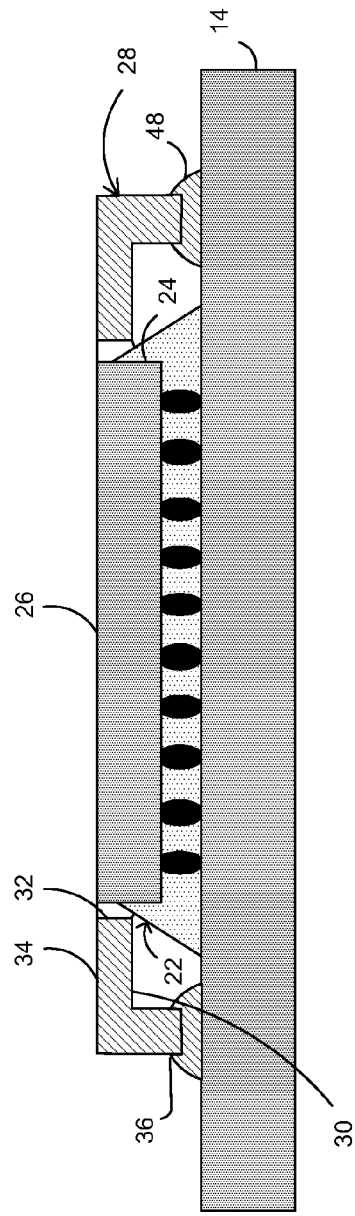
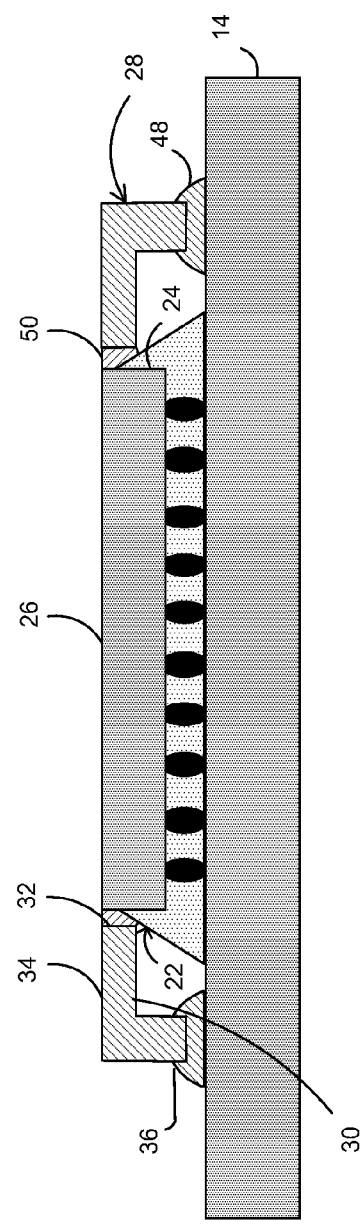

THERMAL MANAGEMENT METHOD INCLUDING A METALLIC LAYER DIRECTLY ON AN INTEGRATED HEAT SPREADER AND INTEGRATED CIRCUIT

CROSS-REFERENCES TO RELATED APPLICATIONS

This present application is a divisional of U.S. patent application Ser. No. 11/090,396 filed Mar. 25, 2005, and entitled "INTEGRATED CIRCUIT THERMAL MANAGEMENT METHOD AND APPARATUS". The specification of said patent is hereby incorporated in its entirety, except for those sections, if any, that are inconsistent with this specification.

FIELD OF THE INVENTION

Disclosed embodiments of the present invention relate to the field of integrated circuits, and more particularly to providing thermal management for integrated circuits.

BACKGROUND OF THE INVENTION

With the advancement of integrated circuit technology, the number of transistors within an integrated circuit has increased exponentially. This increased concentration of transistors has led to a super hot core within the integrated circuit die (die) during integrated circuit operation. With this super hot core, good thermal management is crucial to prevent integrated circuit performance degradation. Typically, various thermal management techniques are employed to ensure that the integrated circuit core temperature is maintained in an acceptable range.

Often times, thermal management of the integrated circuit requires the use of a thermal dissipation device, such as a heatsink to dissipate heat generated by the integrated circuit. A heatsink includes a mass of material thermally coupled to the integrated circuit to conduct thermal energy away from the high-temperature region of the integrated circuit to a low-temperature region of the heatsink. The thermal energy can then be dissipated from a surface of the heatsink to the environment surrounding the heatsink primarily by convection.

An integrated heat spreader (IHS) is typically placed between the integrated circuit and the heatsink. When two solids are placed together, in addition to their respective bulk thermal resistances, there will be thermal interfacial contact resistance between the solids due to the inherent irregularities of the contacting surfaces. For this reason, a first layer of thermal interface material (TIM) is often placed between the integrated heat spreader and the integrated circuit to better wet the interfaces to minimize thermal contact resistance between the integrated circuit and the integrated heat spreader. Likewise a second layer of thermal interface material is placed between the integrated heat spreader and the heatsink. Unfortunately, no matter how well the contact is, there will still be gaps in the interfaces. The current polymer-based and solder-based thermal interface material technology is limited in its ability to meet the heat transfer needs of the ever advancing concentration of transistors in today's integrated circuit.

One attempt to improve on the polymer-based and solder-based thermal interface material technology is the development of thin die thin TIM (TDTT) with improved material bulk thermal conductivity.

BRIEF DESCRIPTION OF THE DRAWINGS

Embodiments of the invention are illustrated by way of example and not by way of limitation in the figures of the accompanying drawings, in which the like references indicate similar elements and in which:

FIGS. 8-12 are cross sectional views taken along line 2-2 in FIG. 1 illustrating the example electronic assembly of FIG. 7 at various stages of construction, in accordance with an embodiment of the present invention.

DETAILED DESCRIPTION OF ILLUSTRATIVE EMBODIMENTS OF THE INVENTION

An apparatus, method, and system for providing thermal management for an integrated circuit is disclosed herein. In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the embodiments of the present invention. It should also be noted that directions and references (e.g., up, down, top, bottom, etc.) may be used to facilitate the discussion of the drawings and are not intended to restrict the application of the embodiments of this invention. Therefore, the following detailed description is not to be taken in a limiting sense and the scope of the embodiments of the present invention is defined by the appended claims and their equivalents.

Figure 1:
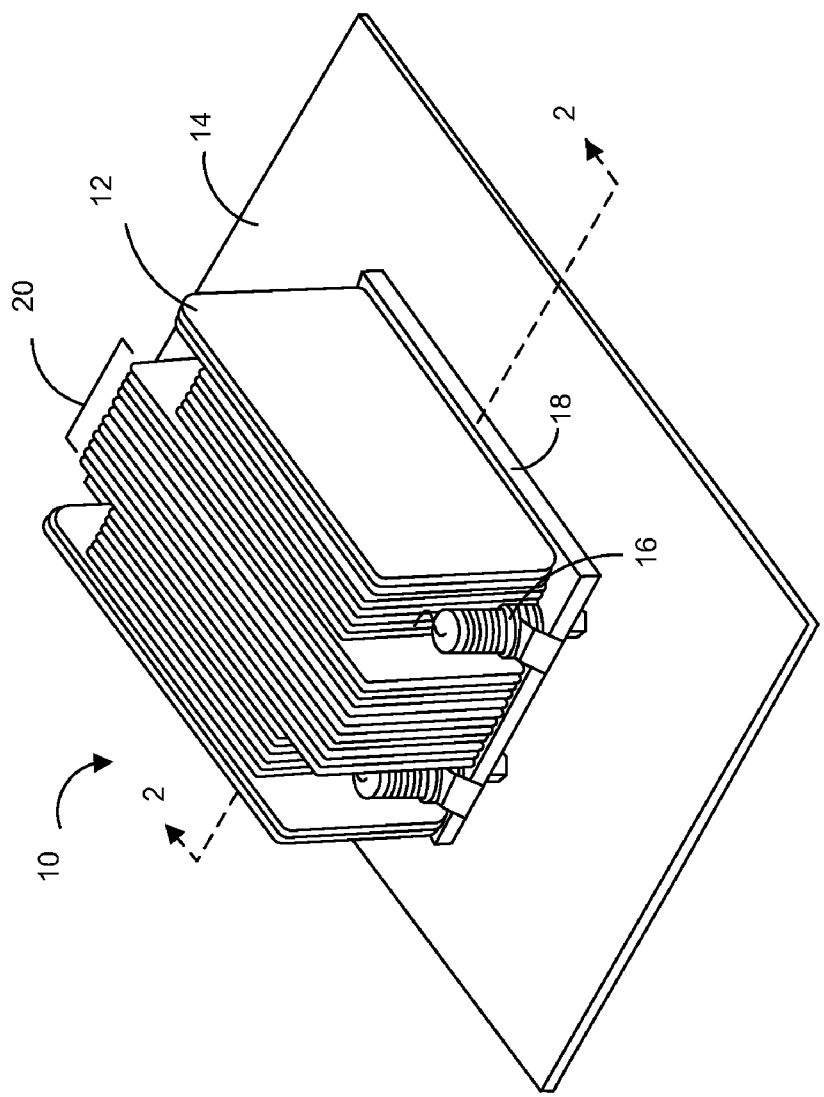
FIG. 1 is a perspective view illustrating an electronic assembly, in accordance with some embodiments of the present invention.

FIG. 1 illustrates a portion of an electronic assembly 10 system, in accordance with one embodiment. The electronic assembly 10 may include a heatsink 12 secured to a substrate 14. The heatsink 12 is positioned over an integrated circuit (not shown) and is in thermal contact with the integrated circuit. A retention mechanism 16 secures the heatsink 12 to the substrate 14. The heatsink 12 may include a base 18 and fins 20 extending from the base 18. The heatsink 12 may be constructed of any suitable thermally conductive materials, according to the requirements of a particular application. Further, the heatsink 12 may be any known or to-be-designed heat dissipation mechanism. In some embodiments of the present invention, the substrate 14 may be a printed circuit board.

Figure 2:
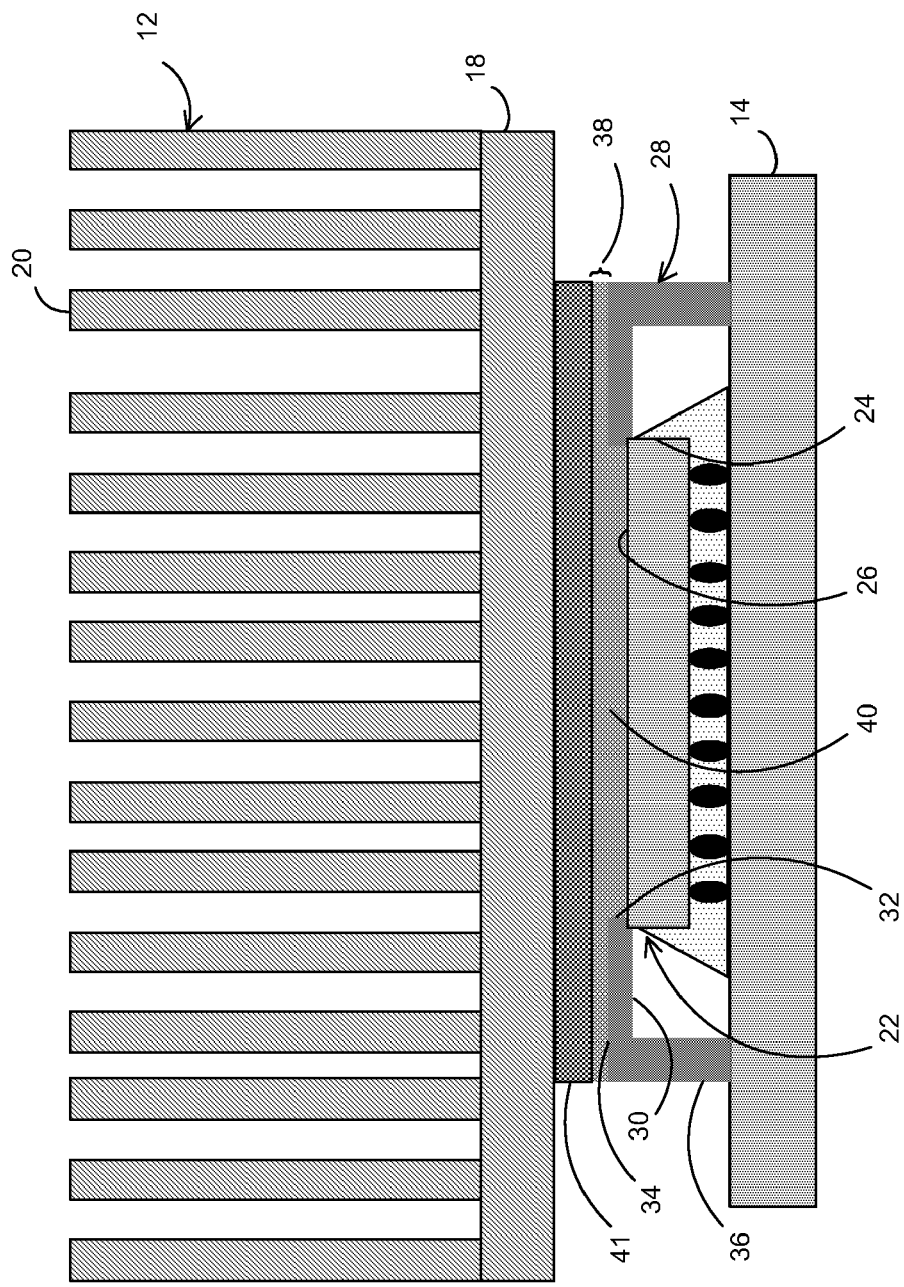
FIG. 2 is a cross sectional view taken along line 2-2 in FIG. 1 illustrating an example electronic assembly, in accordance with an embodiment of the present invention.

FIG. 2 illustrates an example electronic assembly 10, in accordance with an embodiment of the present invention. A semiconductor package 22 may be attached to the substrate 14 and may also be electronically joined to the substrate 14. The semiconductor package 22 may include an integrated circuit 24 having a back surface 26 formed thereon. The integrated circuit 24 may be formed in a rectangular piece of semiconductor material called a chip or a die. Examples of the semiconductor material include, but are not limited to silicon, silicon on sapphire, and gallium arsenide. In some embodiments of the present invention, the integrated circuit 24 may be a processor. For example the integrated circuit 24 may be a microprocessor.

In one embodiment, an integrated heat spreader 28 may be attached to the substrate 14. The integrated heat spreader 28 may be adapted to at most partially cover the integrated circuit 24. The integrated heat spreader 28 may have a substantially cap-like shape, including a ceiling wall 30 having an aperture 32 disposed thereon and an exterior surface 34. The aperture 32 may be adapted to expose the back surface 26 of the integrated circuit 24 at least in part. A plurality of side walls 36 extends from the ceiling wall 30 to the substrate 14 to attach the integrated heat spreader 28 to the substrate 14.

In one embodiment, the aperture 32 of the integrated heat spreader 28 may be adapted to expose less than the entire back surface 26 of the integrated circuit 24. The back surface 26 of the integrated circuit 24 and the exterior surface 34 of the ceiling wall 30 of the integrated heat spreader 28 may be non-coplanar with respect to one another. In this position, the aperture 32 of the integrated heat spreader 28 may be positioned above the back surface 26 of the integrated circuit 24.

The integrated heat spreader 28 may be formed of any suitable material, according to the requirements of the particular application. Examples of materials suitable for forming the integrated heat spreader 28 include, but are not limited to copper or aluminum.

In one embodiment, a metallic layer 38 may be directly placed on the back surface 26 of the integrated circuit 24. The metallic layer 38 may also be directly placed on the exterior surface 34 of the ceiling wall 30 of the integrated heat spreader 28. The metallic layer 38 may include a depressed center region 40. For example, in embodiments where the back surface 26 of the integrated circuit 24 and the exterior surface 34 of the ceiling wall 30 of the integrated heat spreader 28 are non-coplanar with respect to one another, the metallic layer 38 may have a depressed center region 40 at least partially located within the aperture 32 of the integrated heat spreader 28 and positioned above the back surface 26 of the integrated circuit 24. In one embodiment, the heatsink 12 may be thermally coupled to the integrated circuit 24 via the metallic layer 38.

The metallic layer 38 may be formed of any suitable material, according to the requirements of the particular application. Examples of materials suitable for forming the metallic layer 38 include, but are not limited to, copper, nickel, gold or combinations thereof.

In one embodiment, a thermal interface material 41 may be deposited on the metallic layer 38. The thermal interface material 41 is adapted to decrease the thermal resistance in the pathway from the integrated circuit 24. Examples of types of thermal interface materials 41 include, but are not limited to, a thin layer of solder paste, phase-change materials, thermal adhesives (e.g., a highly filled epoxy or acrylic), double-sided thermal tape, and thermal interface pads. In embodiments where thermal interface material 41 is deposited on the metallic layer 38, the heatsink 12 contacts the thermal interface material 41. The heatsink 12 may be thermally coupled to the integrated circuit 24 via the metallic layer 38 as well as via the thermal interface material 41.

Figure 3:
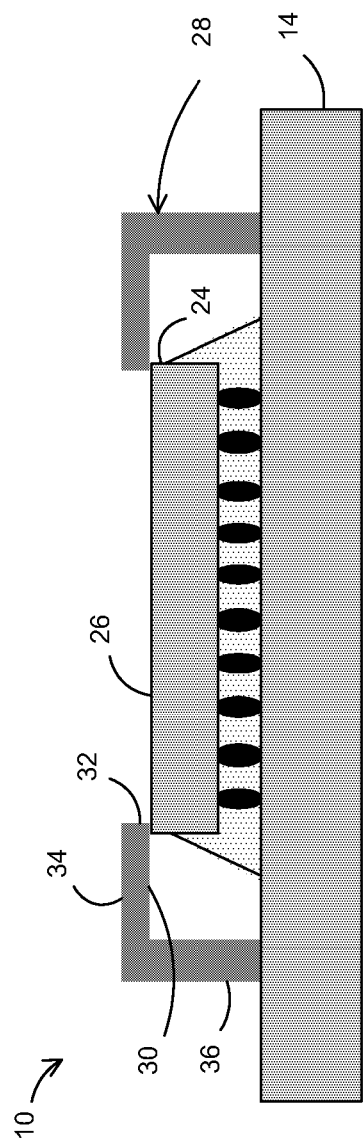
FIGS. 3-6 are cross sectional views taken along line 2-2 in FIG. 1 illustrating the example electronic assembly of FIG. 2 at various stages of construction, in accordance with an embodiment of the present invention.

FIG. 3 illustrates the example electronic assembly 10 at a given stage of construction, in accordance with an embodiment of the present invention. The integrated circuit 24 may be attached to the substrate 14. The integrated heat spreader 28 may be placed over the integrated circuit 24. The aperture 32 of the ceiling wall 30 of the integrated heat spreader 28 may be adapted to expose the back surface 26 of the integrated circuit 24 at least in part.

Figure 4:
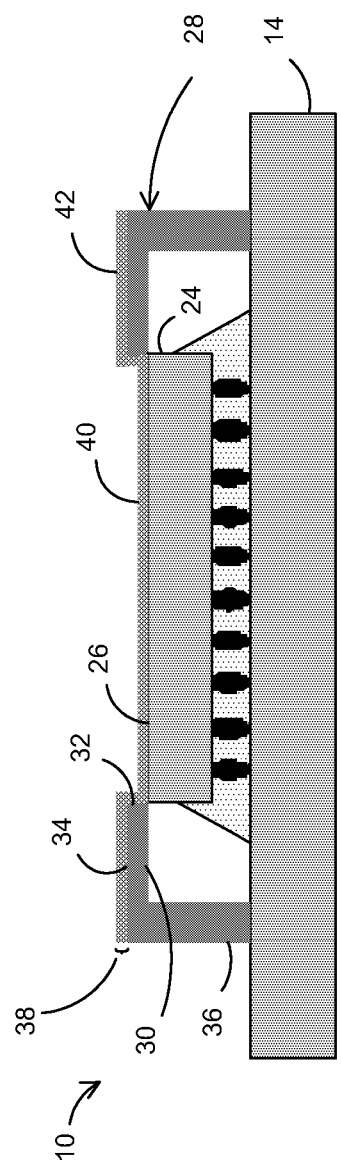

FIG. 4 illustrates the example electronic assembly 10 at a given stage of construction, in accordance with an embodiment of the present invention. The metallic layer 38 may include a first metallic layer 42 placed directly on top of the back surface 26 of the integrated circuit 24. The first metallic layer 42 may also be directly placed on the exterior surface 34 of the ceiling wall 30 of the integrated heat spreader 28. The placing of the first metallic layer 42 may comprise electroless plating where, for example, a copper layer may be placed by electroless plating. In embodiments where the back surface 26 of the integrated circuit 24 and the exterior surface 34 of the ceiling wall 30 of the integrated heat spreader 28 are non-coplanar with respect to one another, the first metallic layer 42 may have a depressed center region 40.

Figure 5:
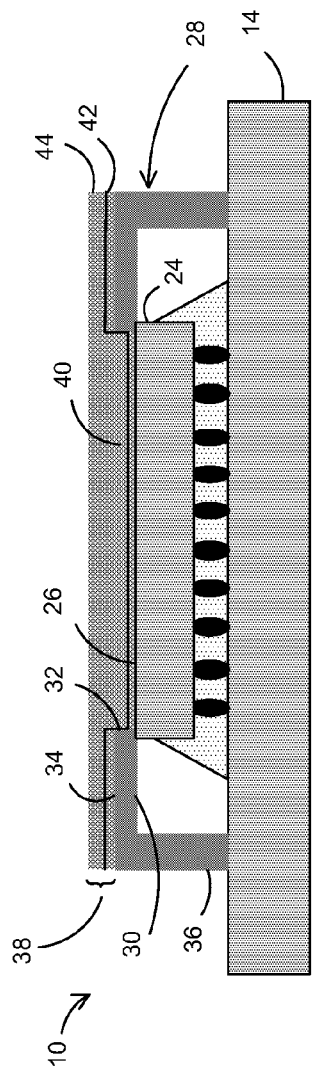

FIG. 5 illustrates the example electronic assembly at a given stage of construction, in accordance with an embodiment of the present invention. The metallic layer 38 may include a second metallic layer 44 placed directly on top of the first metallic layer 42. The first metallic layer 42 may have a first thickness, with the second metallic layer 44 having a second thickness that is thicker than the first thickness. The placing of the second metallic layer 44 may comprise electrolytic plating of a copper layer. In embodiments where the back surface 26 of the integrated circuit 24 and the exterior surface 34 of the ceiling wall 30 of the integrated heat spreader 28 are non-coplanar with respect to one another, the second metallic layer 44 may have a depressed center region 40. Additionally, once the second metallic layer 44 is placed on top of the first metallic layer 42, the second metallic layer 44 may be flattened. For example, mechanical grinding or other processes may be preformed on the second metallic layer 44 to reduce uneven features along the second metallic layer 44.

Figure 6:
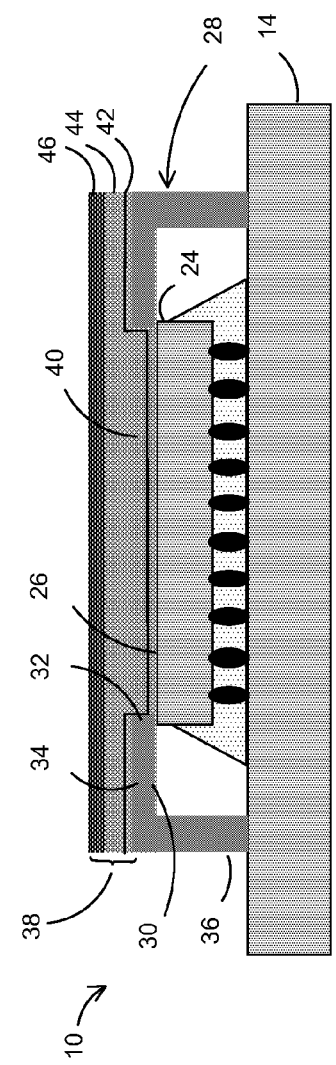

FIG. 6 illustrates the example electronic assembly 10 at a given stage of construction, in accordance with an embodiment of the present invention. The metallic layer 38 may include a third metallic layer 46 placed directly on top of the second metallic layer 44. The third metallic layer 46 may be an anti-oxidation plating layer. Examples of materials suitable for forming an anti-oxidation plating layer include, but are not limited to nickel. With reference to FIG. 2 and FIG. 6, the thermal interface material 41, described in more detail above, may be deposited on the third metallic layer 46 of the metallic layer 38.

Figure 7:
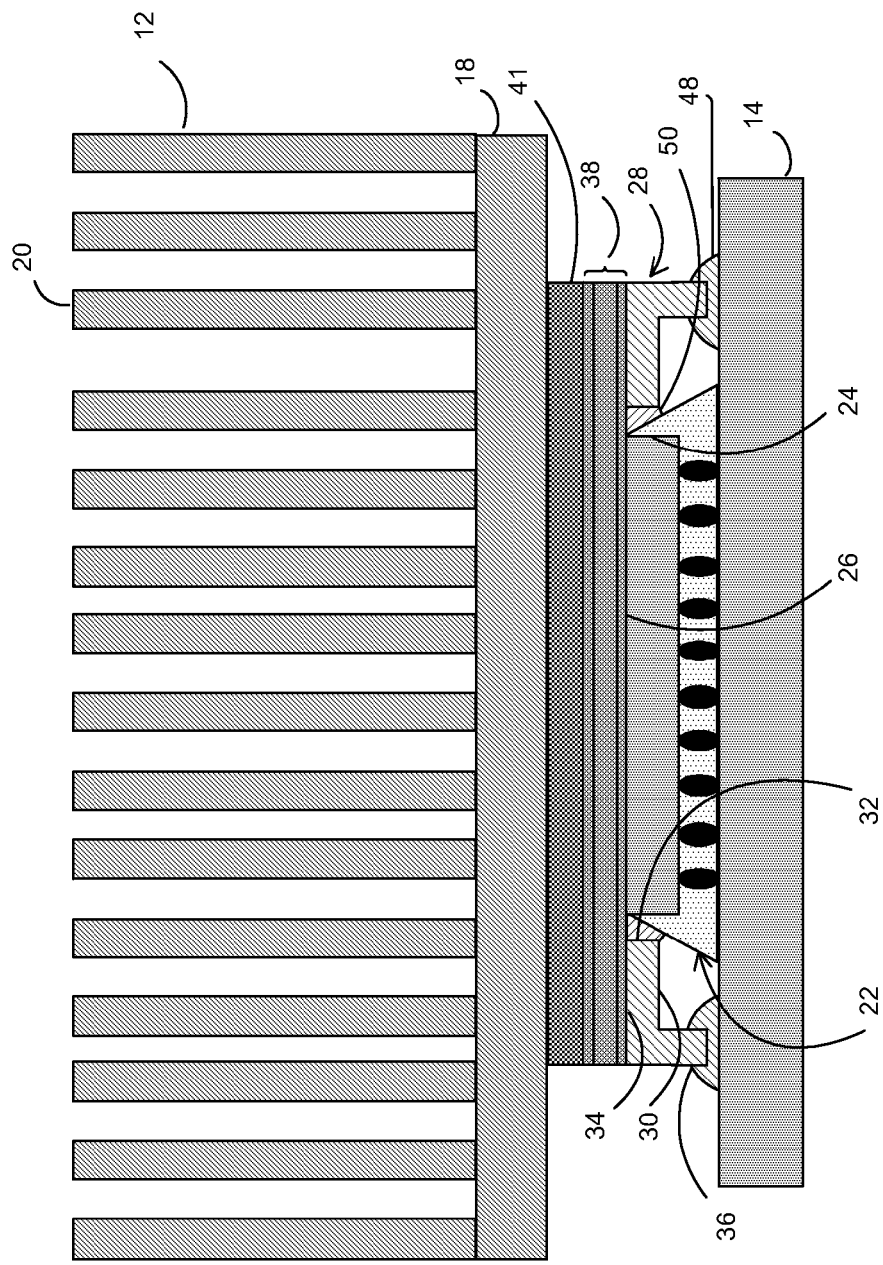
FIG. 7 is a cross sectional view taken along line 2-2 in FIG. 1 illustrating another example electronic assembly, in accordance with an embodiment of the present invention.

FIG. 7 illustrates an example electronic assembly 10, in accordance with an embodiment of the present invention. The integrated heat spreader 28 may be a dummy integrated heat spreader adapted to be placed over the integrated circuit 24. The integrated heat spreader 28 may have a substantially cap-like shape, including a ceiling wall 30 having an aperture 32 disposed thereon and an exterior surface 34. The aperture 32 may be adapted to expose the entire back surface 26 of the integrated circuit 24 in totality. A plurality of side walls 36 extends from the ceiling wall 30 to the substrate 14 to attach the integrated heat spreader 28 to the substrate 14.

In one embodiment, the back surface 26 of the integrated circuit 24 and the exterior surface 34 of the ceiling wall 30 of the integrated heat spreader 28 may be coplanar with respect to one another. In this position, the integrated circuit 24 may be positioned at least partially within the aperture 32 of the integrated heat spreader 28.

In one embodiment, the metallic layer 38 may be directly placed on the back surface 26 of the integrated circuit 24. The metallic layer 38 may also be directly placed on the exterior surface 34 of the ceiling wall 30 of the integrated heat spreader 28. The metallic layer 38 may be substantially flat with no depression or depressed center region. For example, in embodiments where the back surface 26 of the integrated circuit 24 and the exterior surface 34 of the ceiling wall 30 of the integrated heat spreader 28 are coplanar with respect to one another, the metallic layer 38 may be substantially flat with no depression or depressed center region.

FIG. 8 illustrates the example electronic assembly 10 at a given stage of construction, in accordance with an embodiment of the present invention. The integrated heat spreader 28 may be coupled to the substrate 14 with a sealant 48, formed of any suitable material, according to the requirements of the particular application. Various embodiments may use a variety of techniques and/or materials to couple the integrated heat spreader 28 and the substrate 14 to one another.

FIG. 9 illustrates the example electronic assembly 10 at a given stage of construction, in accordance with an embodiment of the present invention. A plugging material 50 may be applied to the aperture 32 of the integrated heat spreader 28. For example, plugging material 50 may be applied to the back surface 26 of the integrated circuit 24 as well as on the exterior surface 34 of the ceiling wall 30 of the integrated heat spreader 28 to fill in open space between the integrated circuit 24 and the aperture 32 of the integrated heat spreader 28. Additionally, once the plugging material 50 is applied to the aperture 32, excess plugging material 50 may be removed. For example, mechanical cleaning or other processes may be preformed on the plugging material 50 to remove plugging material 50 from the back surface 26 of the integrated circuit 24 as well as on the exterior surface 34 of the ceiling wall 30 of the integrated heat spreader 28. The plugging material 50 may be formed of any suitable material, according to the requirements of the particular application. Examples of materials suitable for forming the plugging material 50 include, but are not limited epoxy with silica filler or the like.

Figure 10:
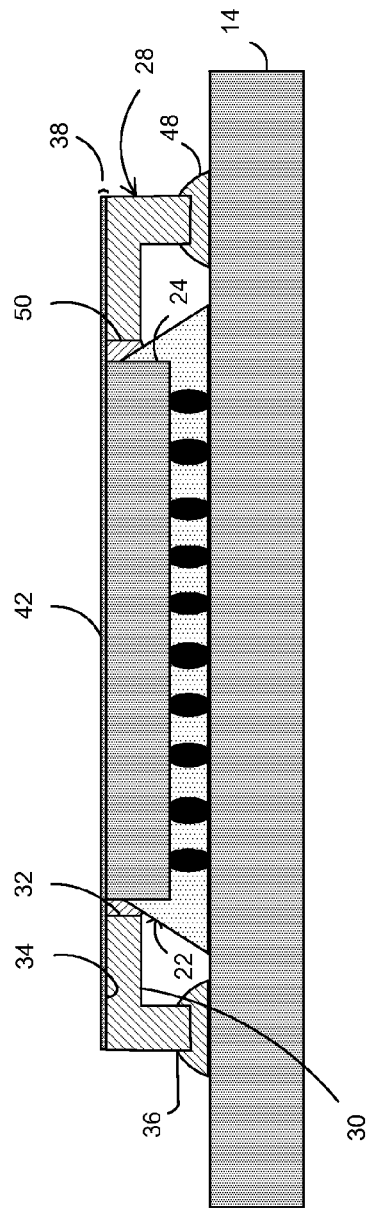

FIG. 10 illustrates the example electronic assembly 10 at a given stage of construction, in accordance with an embodiment of the present invention. The metallic layer 38 may include a first metallic layer 42 placed directly on top of the back surface 26 of the integrated circuit 24. The first metallic layer 42 may also be directly placed on the exterior surface 34 of the ceiling wall 30 of the integrated heat spreader 28. The placing of the first metallic layer 42 may comprise electroless plating where, for example, a copper layer may be placed by electroless plating. In embodiments where the back surface 26 of the integrated circuit 24 and the exterior surface 34 of the ceiling wall 30 of the integrated heat spreader 28 are coplanar with respect to one another, the first metallic layer 42 may be substantially flat with no depression or depressed center region.

Figure 11:
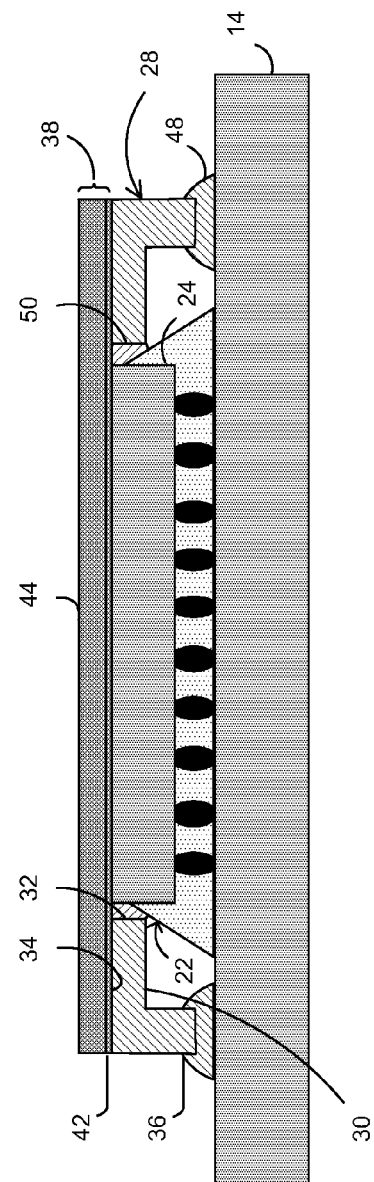

FIG. 11 illustrates the example electronic assembly 10 at a given stage of construction, in accordance with an embodiment of the present invention. The metallic layer 38 may include a second metallic layer 44 placed directly on top of the first metallic layer 42. The first metallic layer 42 may have a first thickness, with the second metallic layer 44 having a second thickness that is thicker than the first thickness. The placing of the second metallic layer 44 may comprise electrolytic plating of a copper layer. In embodiments where the back surface 26 of the integrated circuit 24 and the exterior surface 34 of the ceiling wall 30 of the integrated heat spreader 28 are coplanar with respect to one another, the second metallic layer 44 may be substantially flat with no depression or depressed center region.

Figure 12:
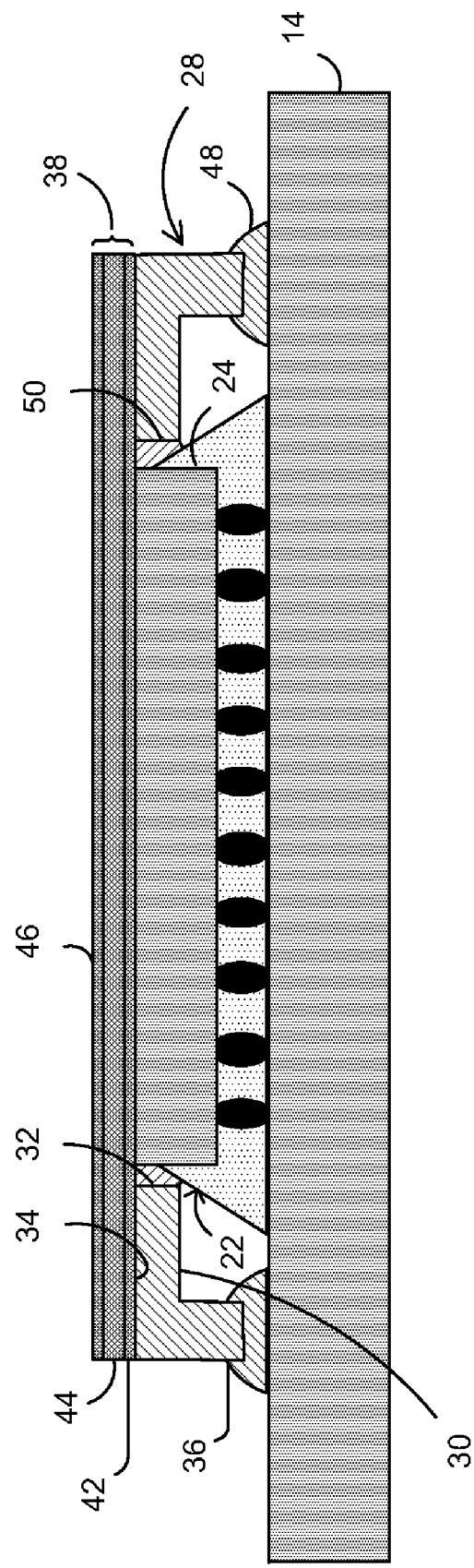

FIG. 12 illustrates the example electronic assembly 10 at a given stage of construction, in accordance with an embodiment of the present invention. The metallic layer 38 may include a third metallic layer 46 placed directly on top of the second metallic layer 44. The third metallic layer 46 may be an anti-oxidation plating layer. Examples of materials suitable for forming an anti-oxidation plating layer include, but are not limited to nickel. With reference to FIG. 7 and FIG. 12, the thermal interface material 41, described in more detail above, may be deposited on the third metallic layer 46 of the metallic layer 38. The heatsink 12 may be thermally coupled to the integrated circuit 24 via the metallic layer 38 as well as via the thermal interface material 41.

Figure 13:
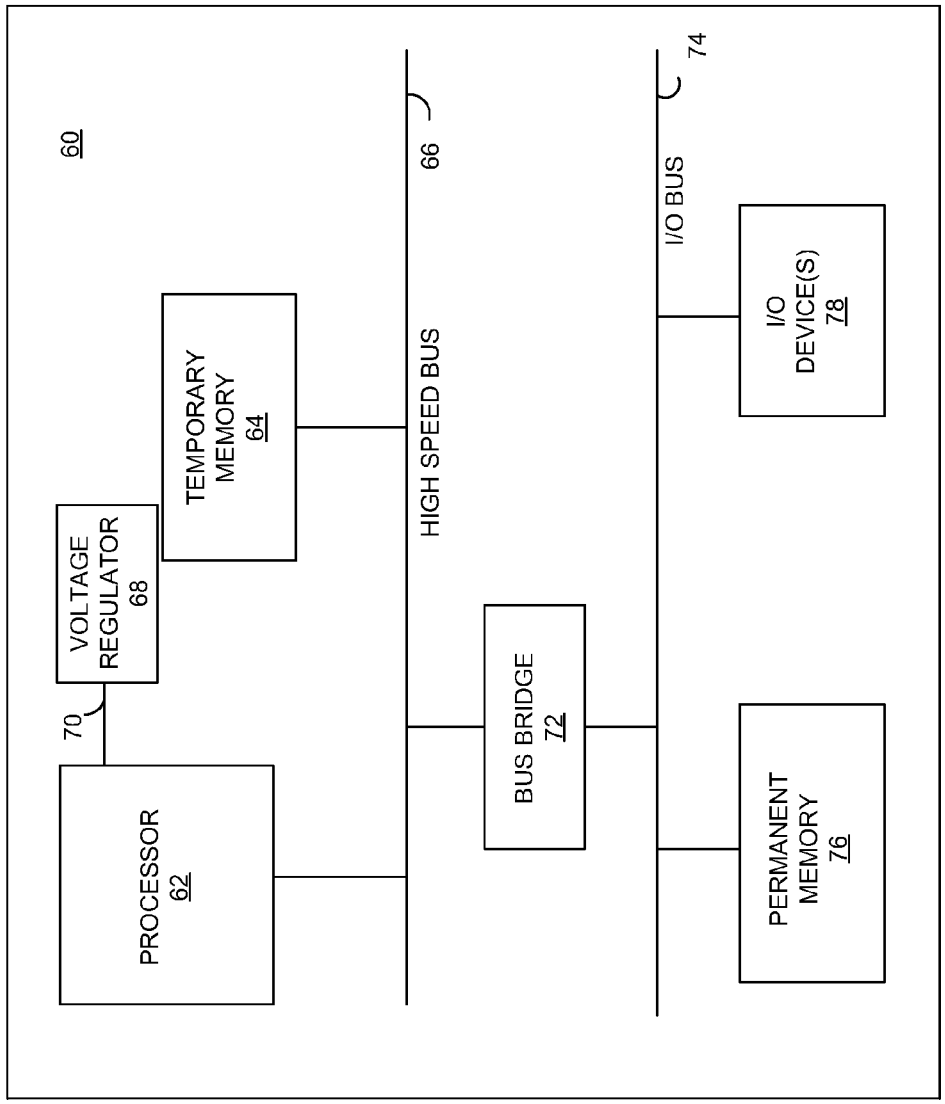
FIG. 13 system including an electronic assembly in accordance with an embodiment of the present invention.

FIG. 13 illustrates a block diagram of one of many possible electronic systems 60 in which embodiments of the present invention may be used. The electronic system 60 may utilize one or more embodiments of the electronic assembly 10 described herein. As shown, the system 60 includes a processor 62, such as an integrated circuit, and temporary memory 64, such as SDRAM and DRAM, on high-speed bus 66. Voltage regulator 68 may be utilized to provide power to processor 62 via traces 70. The high-speed bus 66 is connected through bus bridge 72 to input/output (I/O) bus 74. I/O bus 74 connects permanent memory 76, such as flash devices and mass storage device (e.g. fixed disk device), and I/O devices 78 to each other and bus bridge 72.

In various embodiments, system 60 may be a set-top box, a digital camera, a CD player, a DVD player, a wireless mobile phone, a tablet computing device, or a laptop computing device.

Some embodiments of the invention provide an advantage in that the need for placing thermal interface material between the integrated heat spreader 28 and the integrated circuit 24 is eliminated. This elimination of the thermal interface material between the integrated heat spreader 28 and the integrated circuit 24 creates an improved heat spreading effect from the integrated circuit 24 to the integrated heat spreader 28. Further, in some embodiments the contact resistance between the integrated circuit 24 and the integrated heat spreader 28 is reduced or eliminated.

Additionally, in some embodiments the use of the metallic layer 38 creates an improved thermal dissipation as the metallic layer 38 may be formed of a material having better thermal conductivity than available thermal interface materials. Further, some embodiments of the invention provide a reduction in the overall height required for the electronic assembly 10.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method comprising:
  attaching an integrated circuit to a substrate;

placing an integrated heat spreader having a substantially cap-like shape on the substrate, with an aperture of a ceiling wall of the integrated heat spreader exposing a back surface of the integrated circuit at least in part; and placing a first metallic layer directly on top of an exterior surface of the ceiling wall of the integrated heat spreader and the back surface of the integrated circuit.

2. The method of claim 1, wherein the placing of the first metallic layer comprises electroless plating of a copper layer on said exterior surface of the ceiling wall of the integrated heat spreader and the back surface of the integrated circuit.

3. The method of claim 1, further comprising placing a second metallic layer directly on said first metallic layer and placing third metallic layer directly placed on said second metallic layer, wherein the first metallic layer comprises a first copper layer of a first thickness, the second metallic layer comprises a second copper layer of a second thickness, that is thicker than the first thickness, and the third metallic layer comprises a nickel layer.

4. The method of claim 1, further comprising exposing less than the entire back surface of the integrated circuit through the aperture, and wherein the first metallic layer has a depressed center region, the back surface of the integrated circuit and the exterior surface of the ceiling wall of the integrated heat spreader being non-coplanar.

5. The method of claim 1, further comprising exposing the entire back surface of the integrated circuit through the aperture, and wherein the first metallic layer is substantially flat with no depression, the back surface of the integrated circuit and the exterior surface of the ceiling wall of the integrated heat spreader being coplanar.

6. A method comprising:

attaching an integrated circuit to a substrate;

placing a dummy integrated heat spreader having a substantially cap-like shape on the substrate, with an aperture of a ceiling wall of the dummy integrated heat spreader exposing a back surface of the integrated circuit in totality; and placing a first metallic layer directly on top of an exterior surface of the ceiling wall of the dummy integrated heat spreader and the back surface of the integrated circuit.

7. The method of claim 6, wherein the placing of the first metallic layer comprises electroless plating of a copper layer on said exterior surface of the ceiling wall of the dummy integrated heat spreader and the back surface of the integrated circuit.

8. The method of claim 6, further comprising placing a second metallic layer directly on said first metallic layer and placing third metallic layer directly placed on said second metallic layer, wherein the first metallic layer comprises a first copper layer of a first thickness, the second metallic layer comprises a second copper layer of a second thickness, that is thicker than the first thickness, and the third metallic layer comprises a nickel layer.

9. The method of claim 6, wherein the first metallic layer is substantially flat with no depression, the back surface of the integrated circuit and the exterior surface of the ceiling wall of the dummy integrated heat spreader being coplanar.

* * * * *